United States Patent
Atsatt

(10) Patent No.: US 8,680,886 B1
(45) Date of Patent: Mar. 25, 2014

(54) APPARATUS FOR CONFIGURABLE ELECTRONIC CIRCUITRY AND ASSOCIATED METHODS

(75) Inventor: Sean R. Atsatt, Sana Cruz, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/105,976

(22) Filed: May 12, 2011

Related U.S. Application Data

(60) Provisional application No. 61/334,562, filed on May 13, 2010.

(51) Int. Cl.
   *H03K 19/173* (2006.01)
(52) U.S. Cl.
   USPC .............................................. 326/38; 326/39
(58) Field of Classification Search
   None
   See application file for complete search history.

(56) References Cited

U.S. PATENT DOCUMENTS

| | | | | |
|---|---|---|---|---|
| 6,011,407 | A | * | 1/2000 | New ................................. 326/39 |
| 6,034,542 | A | * | 3/2000 | Ridgeway ......................... 326/39 |
| 7,088,132 | B1 | * | 8/2006 | Tang et al. ....................... 326/39 |
| 7,444,454 | B2 | * | 10/2008 | Yancey et al. ................. 710/312 |
| 7,724,032 | B2 | * | 5/2010 | Hutton et al. .................... 326/41 |
| 2005/0257031 | A1 | * | 11/2005 | Kundu et al. ................. 712/226 |

OTHER PUBLICATIONS

"Spartan-6 FPGA Memory Controller User Guide," UG388 (v2.3) Aug. 9, 2010, 66 pp.
"Avalon Interface Specifications," version 1.2, Apr. 2009, 66 pp.
U.S. Appl. No. 13/105,968, filed May 12, 2011, Atsatt et al.

* cited by examiner

*Primary Examiner* — Crystal L Hammond
(74) *Attorney, Agent, or Firm* — Law Offices of Maximilian R. Peterson

(57) ABSTRACT

An apparatus for implementing an electronic design includes a structured application specific integrated circuit (ASIC). The structured ASIC includes circuitry that is adapted to implement functionality of a field programmable gate array (FPGA) that implements a part of the electronic design, as well as circuitry that is adapted to implement the functionality of at least one more FPGA that implement(s) another part (or additional parts) of the electronic design.

23 Claims, 9 Drawing Sheets

| | # | Name | Description |
|---|---|---|---|
| Avalon ST Sink | 1 | ready | Indicates that the interface is ready to accept data |
| | 1 | valid | Indicates that the data is valid |
| | n | data | Data to be transferred (arbitrary width) |
| | 1 | endofpack | Single beat pulse that marks the end of a packet |
| | 1 | startofpack | Single beat pulse that marks the start of a packet |

Fig. 4

| | | # | Name | Description |
|---|---|---|---|---|
| Avalon ST | Sink | 1 | ready | Indicates that the interface is ready to accept data |
| | | 1 | valid | Indicates that the data is valid |
| | | n | data | Data to be transferred (arbitrary width) |

Fig. 5

| | | # | Name | Description |
|---|---|---|---|---|
| Avalon ST | Sink | 1 | ready | Indicates that the interface is ready to accept data |
| | | 1 | valid | Indicates that the data is valid |
| | | n | data | Data to be transferred (arbitrary width) |
| | | k | channel | Identifies a group that the transaction belongs to |
| | | 1 | endofpack | Single beat pulse that marks the end of a packet |
| | | 1 | startofpack | Single beat pulse that marks the start of a packet |

APPARATUS FOR CONFIGURABLE ELECTRONIC CIRCUITRY AND ASSOCIATED METHODS

CROSS-REFERENCE TO RELATED APPLICATIONS

This application claims priority to, and incorporates by reference, U.S. Provisional Patent Application Ser. No. 61/334,562, filed on May 13, 2010, titled "Composable Field Programmable Gate Array and Associated Methods."

TECHNICAL FIELD

This disclosure relates generally to electronic circuitry and, more particularly, to composable electronic circuitry, such as field programmable gate arrays (FPGAs), and associated methods.

BACKGROUND

To provide more flexibility to users, some providers of electronic integrated circuits (ICs) have made available devices known by various names, such as FPGAs. FPGAs provide a relatively large degree of configuration or programming capability to the user. FPGAs provide designers with flexibility in designing systems for information/data processing. By having the ability to program or configure the FPGA, designers can effectively change the system specifications or performance. Further, end users may configure or program the FPGA to suit their applications.

In some situations, the user might desire less configuration or programming capability, and a correspondingly lower amount of electronic circuitry on the IC. In those situations, some providers, for example, Altera Corporation, have provided devices known by names such as structured application specific IC (ASIC), for example, Altera Corporation's Hardcopy devices. The user may partition an ASIC design or other design into a set of FPGAs. The user may use a model that begins with an FPGA and provides a mechanism for conversion to a structured ASIC, such as Hardcopy.

SUMMARY

The disclosed concepts may be used in a wide variety of embodiments in order to provide composable electronic circuitry, such as composing a single structured ASICs from multiple FPGAs. In one exemplary embodiment, an apparatus for implementing an electronic design includes a structured ASIC, which includes a circuit that is adapted to implement the functionality of an FPGA that implements a part of the electronic design. The structured ASIC also includes a circuit that is adapted to implement the functionality of a second FPGA that implements a part of the electronic design.

In another exemplary embodiment, an apparatus includes a single structured ASIC that includes circuitry composed from a plurality of FPGAs. The composed circuitry is adapted to provide one to one behavior between the structured ASIC and the plurality of FPGAs.

In yet another exemplary embodiment, a method includes adapting a circuit in a structured ASIC to implement the functionality of at least a part of the circuitry in an FPGA, and adapting a second circuit in the structured ASIC to implement the functionality of at least a part of circuitry in a second FPGA. The method also includes coupling the two circuits in the structured ASIC via a transport mechanism.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIG. 4 depicts the protocol signaling scheme according to an exemplary embodiment.

FIG. 5 the protocol signaling scheme according to another exemplary embodiment.

FIG. 6 the protocol signaling scheme according to yet another exemplary embodiment.

DETAILED DESCRIPTION

This disclosure extends the structured ASIC (e.g., Altera Corporation's Hardcopy) model to composing single structured ASICs from multiple FPGAs (composing circuitry according to the behavior of functionality of the corresponding circuitry in the FPGAs) in a manner that facilitates one to one or exact one to one behavior match between the multiple FPGAs and the single structured ASIC. In other words, the user may have a design implemented or mapped to a set of two or more FPGAs. Using the disclosed techniques, the user may map or implement that design into a structured ASIC. The design implemented in the structured ASIC exhibits one to one or exact behavior as does the design in the multiple FPGAs.

The methodology prescribes an interface protocol that the customer subscribes to or uses at the boundaries between the two or more FPGAs. This protocol is transport agnostic or independent (a variety of transport mechanisms or hardware may be used) and may be bounded to desired behaviors. Serial clock data recovery (CDR) transport protocols, such as Altera Corporation's Serial Lite, may be used as a pin efficient transport method. As described below in detail, CAD tool or software, such as Altera Corporation's Quartus software, may be used to stitch or combine the two or more FPGAs (i.e., the designs, functionality, and/or circuitry of the two or more FPGAs) together at the interface boundaries by inserting desired or specified adaptation to provide one to one behavior between the single structured ASIC device (e.g., Hard Copy device) and the two or more separate FPGAs. As described below in detail, a variety of interface protocols and adapters may be used to support or provide these features.

Figure 1:
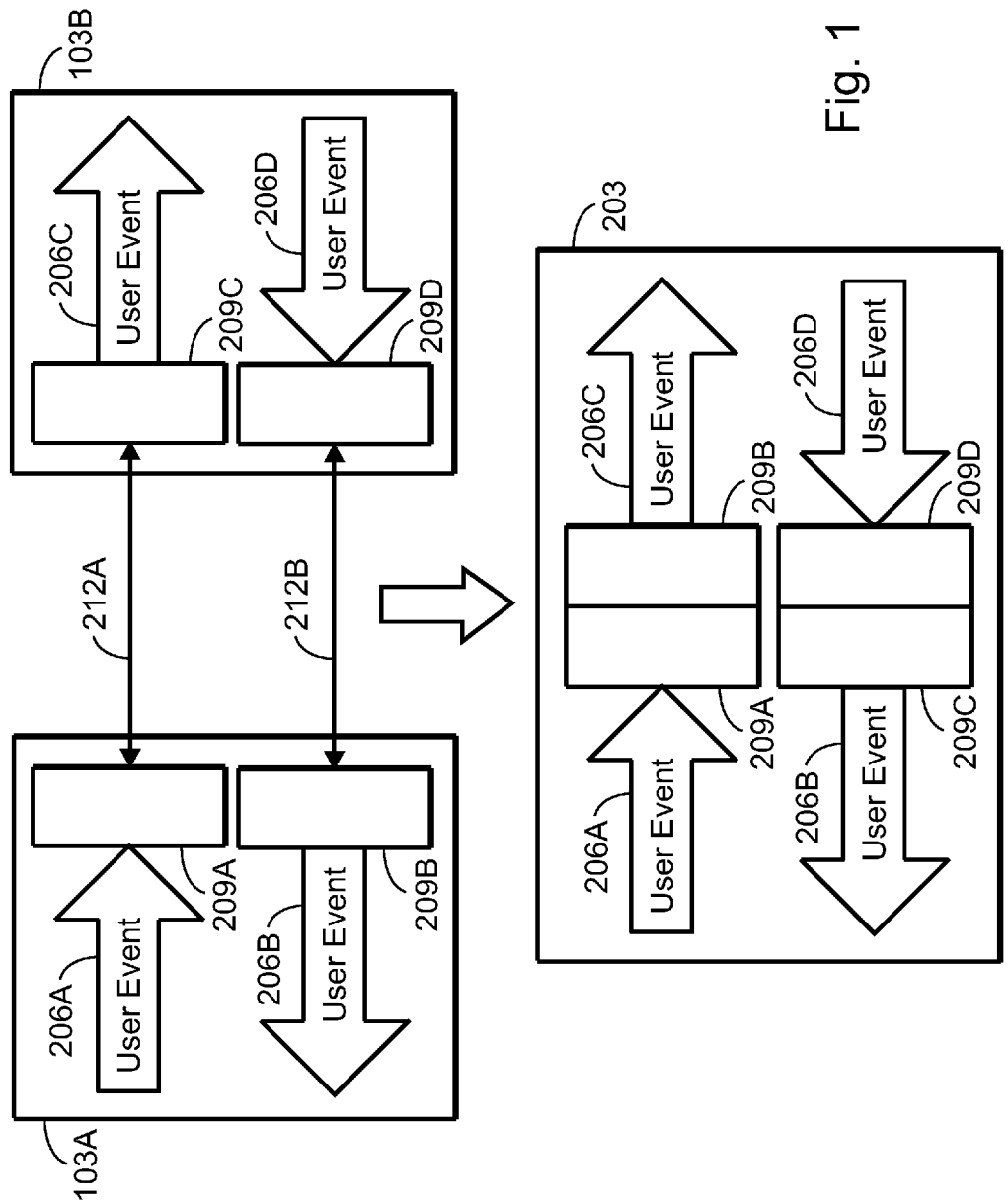
FIG. 1 shows the composition of a single structured ASIC from two FPGAs, according to an exemplary embodiment.

FIG. 1 shows composing a single structured ASIC from two FPGAs, according to an exemplary embodiment. In some embodiments, FPGAs 103A-103B may include some or at least a part of (e.g., when more than two FPGAs are used) or all of the user's design and/or some or at least a part of (e.g., when more than two FPGAs are used) or all of two subsystems or modules. In some embodiments, FPGAs may include all of the user's design, parts and/or all of two subsystems or modules.

FPGAs 103A-103B can communicate user events (e.g., packets, transactions, communication, exchange of data or information, etc.) to each other. FPGA 103A includes interface adapters 209A-209B for communication with FPGA103B via links 212A-212B. A user event 206A may be communicated from circuitry (for example, programmable logic, programmable interconnect, etc.) in FPGA 103A via interface adapter 209A and link 212A to interface adapter 209C in FPGA 103B, which gives rise to user event 206C in FPGA 103B.

Similarly, FPGA 103B includes interface adapters 209C-209D for communication with FPGA 103A via links 212A-212B. For example, a user event 206D may be communicated from circuitry (for example, programmable logic, programmable interconnect, etc.) in FPGA 103B via interface adapter 209D and link 212B to interface adapter 209B in FPGA 103A, which gives rise to user event 206B in FPGA 103A.

Links 212A-212B provide transport mechanisms for communication between FPGAs 103A-103B. A variety of transport mechanisms may be used, as persons of ordinary skill in the art understand. In exemplary embodiments, links 212A-212B may facilitate two-way communication between FPGAs 103A-103B (as shown), or one-way communication, or a combination of the two, as desired.

Interface adapters 209A-209D allow the combination of the design or functionality in FPGAs 103A-103B so that the combination may be included in structured ASIC 203. In other words, FPGAs 103A-103B are composed into a single structured ASIC 203, while providing one to one or exact one to one behavior between FPGAs 103A-103B and structured ASIC 203. Such a combination or composition provides the same functionality in structured ASIC 203 as provided by FPGAs 103A-103B.

As noted, a plurality of FPGAs (some of the circuitry in the FPGAs), the functionality or behavior of a plurality of FPGAs, may be composed or combined into a structured ASIC. Furthermore, one or more user events, e.g., user events 206A, 206B, etc., may be generated in one or more FPGAs.

Figure 2:
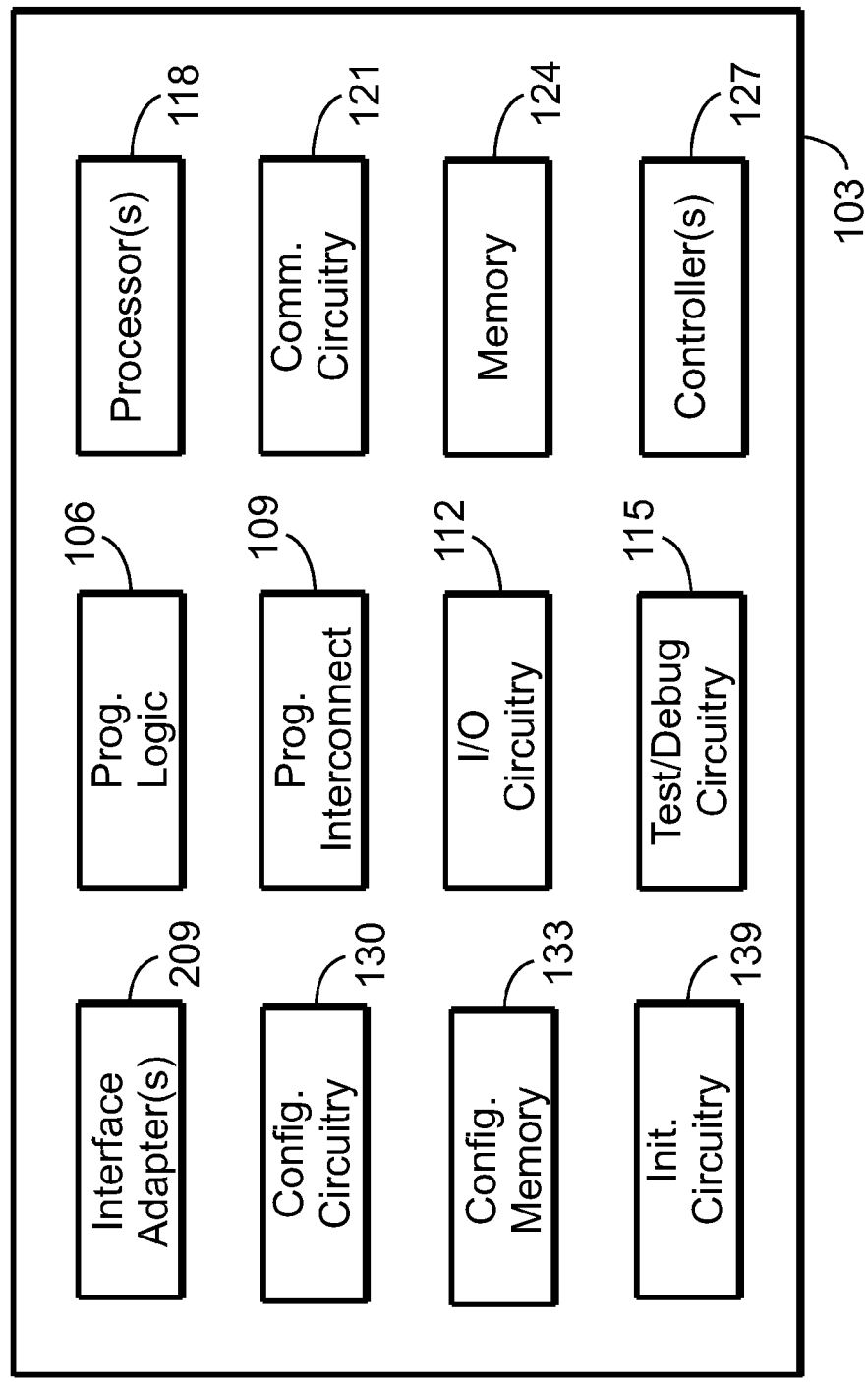
FIG. 2 illustrates a block diagram of an FPGA, a plurality of which may be composed or combined according to an exemplary embodiment.

In exemplary embodiments, a variety of FPGA architectures may be supported. FIG. 2 shows a block diagram of an FPGA according to an exemplary embodiment. FPGA 103 includes configuration circuitry 130, configuration memory (CRAM) 133, interface adapter(s) 209 (e.g., similar to or the same as interface adapters 209A-209D described above), programmable logic 106, programmable interconnect 109, and input/output (I/O) circuitry 112. In addition, FPGA 103 may include test/debug circuitry 115, one or more processors 118, one or more communication circuitry 121, one or more memories 124, one or more controllers 127, and initialization circuit 139, as desired. FPGA 103 may include other blocks and circuitry, as persons of ordinary skill in the art understand. Examples of such circuitry include clock generation and distribution circuits, and the like. Furthermore, FPGA 103 may include, analog circuitry, other digital circuitry, and/or mixed-signal circuitry, as desired.

Generally speaking, a variety of circuitry or blocks, e.g., programmable logic 106, programmable interconnect 109, and I/O circuitry 112, processor(s) 118, etc., may generate one or more user events. The following description provides details of the blocks shown in FIG. 2. Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103 (for example, by using pass gates and/or MUXs).

Initialization circuit 139 may cause the performance of various functions at reset or power-up of FPGA 103. I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices. Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuits 121. Communication circuit(s) 121 may facilitate data and information exchange between various circuits within FPGA 103 and circuits external to FPGA 103, as persons of ordinary skill in the art understand. Examples of communication circuit 121 include transceivers, serializer/deseriallizer (SERDES), network interface circuits, etc. FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired. Memory controller 127 allows interfacing to, and controlling the operation and various functions of circuitry outside the FPGA. For example, memory controller 127 may interface to and control an external synchronous dynamic random access memory (SDRAM).

Referring to FIG. 1, in exemplary embodiments, a set of interface protocols are prescribed that may be used with interface adapters 209A-209D. The interface protocols may be used at the boundary between FPGAs 103A-103B (or more FPGAs, as desired) such that the behavior seen at the interface is the same, independent of whether each interface is within the same silicon die (e.g., structured ASIC 203) or device, or crosses input-output (I/O) boundaries between two silicon devices (e.g., FPGAs 103A-103B in the embodiment shown in FIG. 1).

A transaction level interface may be used so that responses to transactions between FPGAs 103A-103B may be time stamped and be made to occur (regardless of whether they occur in FPGAs 103A-103B or in structured ASIC 203 after the combination) on a specific clock cycle relative to the initiation of the transaction. This transaction interface may be considered as essentially the Avalon ST interface (or similar interface or any interface that satisfies the signaling scheme described here), with a transaction protocol layer used to define various meaningful transactions between the two interfaces. Examples of transactions include packet read/write, memory mapped read/write, signal state change, and interrupt. In exemplary embodiments, the circuitry (e.g., programmable logic, programmable interconnect, etc.) circuitry that connects or couples to these interfaces is designed or configured to be able to tolerate a moderate amount of latency. Note that the disclosed concepts may be applied to relatively large circuits in systems that utilize Altera's (or other provider's) largest FPGAs.

Using the disclosed techniques to combine the functionality of multiple FPGAs into one structured ASIC provides a number of advantages and benefits, including: (a) allow structured ASIC larger than a single FPGA to be constructed; (b) allowing a CAD-tool based methodology to provide one to one behavioral correspondence between separate FPGAs and a single structured ASIC; (c) allowing transport via asynchronous protocols, thus hiding or masking variable latency because of synchronization; (d) allowing for CAD-tool based control over relaxed one to one correspondence for applications that can take advantage of this feature. For example, the latency for the structured ASIC may be made lower than the latency for separate FPGAs. As a second example, the bandwidth for the structured ASIC may be made higher than the bandwidth for separate FPGAs. As a third example, transaction level correspondence versus cycle level correspondence may be provided.

In order to provide one to one or exact one to one behavior, a baseline interface protocol is defined such that the ordering and timing of events can be provided across that interface. The classes of events which are supported with this invention include packet transfers, first-in first-out (FIFO) transfers; memory-mapped read or write transactions; data value changes; and interrupt events.

Each of the event types may be signaled through a standard interface circuit. In exemplary embodiments, the standard interface may have the following properties: (a) synchronous or pseudo synchronous interface to the user logic; (b) the ability for events (e.g., user events 206A, 206D) to be broken down into a set of lower level unidirectional packets to be transmitted between interface adapters (e.g., from interface adapter 209A to interface adapter 209C or from interface adapter 209D to interface adapter 209B). The event types may be implemented in a such a way that they meet the above properties for the interface, are transport agnostic or independent, and provide one to one timing behavior when the transport mechanism is changed when making the transition or composing from separate FPGAs to a single structured ASIC.

With respect to types of transport, in exemplary embodiments, fixed latency or variable latency transports may be used. In fixed latency transports, the latency of the transport for any given event is known a priori. In contrast, for variable latency transports, the latency of the transport the latency of the transport for any given event is unknown a priori. As described below, maintaining the desired properties may be achieved for the different events, when using a variable latency transport, such as Altera Corporation's Serial Lite, the implementation overhead may be reduced or eased for fixed latency protocols, and implementation overhead for relaxed correspondence requirements or specifications may also be used.

Figure 3:
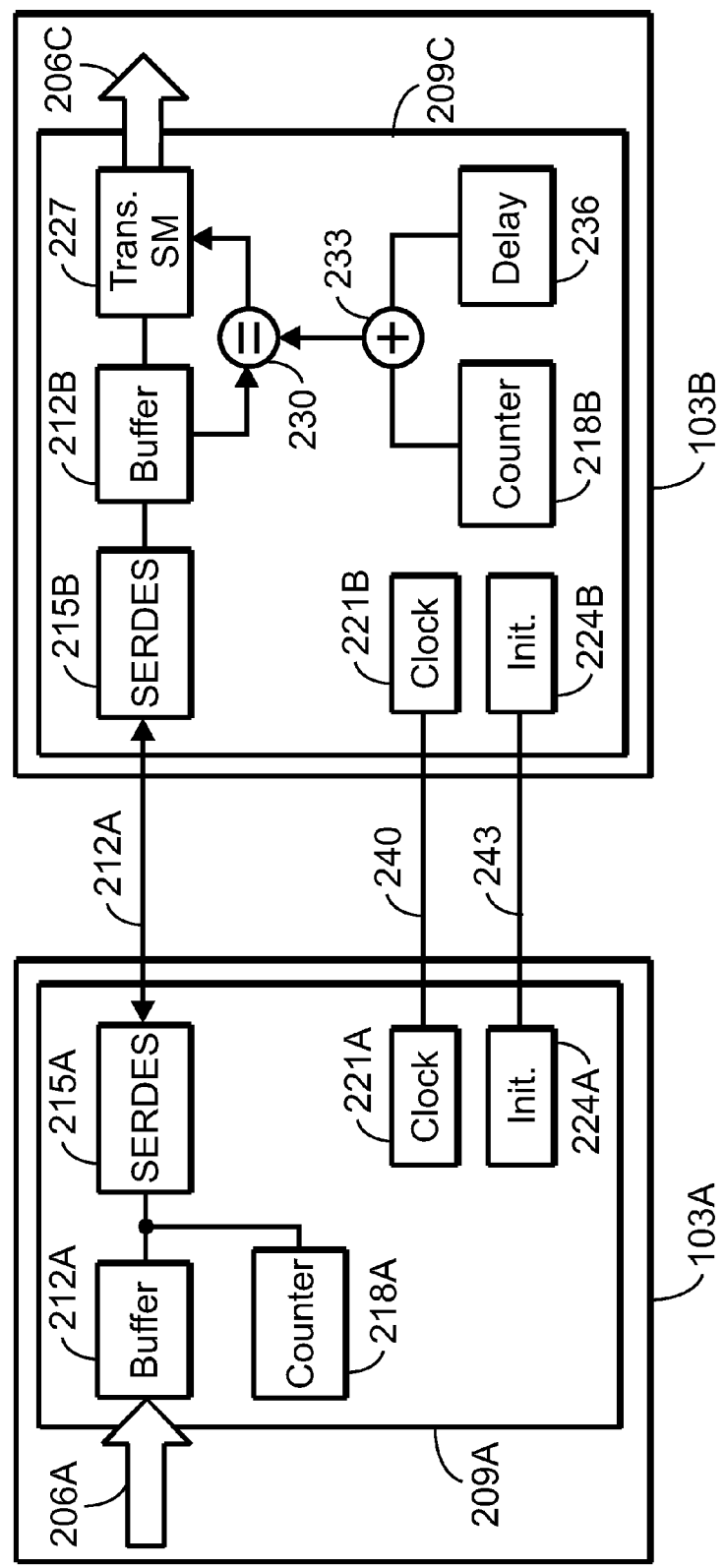
FIG. 3 shows a block diagram of interface adapters in FPGAs according to an exemplary embodiment.

Fixed latency for variable latency transport may be provided by delaying the transactions to the maximum latency of the transport. In some cases, for point to point connections or couplings, the additional latency delay that is added compensates for synchronization variation, which is typically a relatively small number of clock cycles. To maintain the clock cycle level of accuracy, the FPGAs (e.g., FPGAs 103A-103B in FIG. 1) should have access to a common phase locked clock signal and a common phase locked initialize signal. FIG. 3 shows such an arrangement according to an exemplary embodiment.

FPGA 103A includes counter 218A, buffer 212A, SERDES circuit 215A, clock circuit 221A, and initialization circuit 224A. Similarly, FPGA 103B includes counter 218B, buffer 212B, SERDES circuit 215B, clock circuit 221B, and initialization circuit 224B. In addition, FPGA 103B includes delay circuit 236, adder 233, and comparator 230. Note that SERDES circuits 215A-215B are used because the example shown uses a serial transport mechanism. Other types of circuitry may be used for other transport mechanisms, as persons of ordinary skill in the art understand. Furthermore, the example shown assumes that even 206A originates in FPGA 103A and gives rise to event 206C in FPGA 103B. As persons of ordinary skill in the art understand, similar circuits may be used where an event originates in FPGA 103B and gives rise to an event in FPGA 103A.

Counters 218A, 218B, which roll over at a time period longer than the maximum latency of the transport are synchronized to the same exact clock count. Clock circuits 221A, 221B provide a common phase locked clock signal 240 to both FPGA 103A and FPGA 103B. In addition, initialization circuits 224A, 224B provide a common phase locked initialize signal 243 to both FPGA 103A and FPGA 103B.

When a transaction is sent across the transport via link 212A, it includes a header value that specifies the counter value on which the transaction was initiated on the transmitter or source side (FPGA 103A in the example shown). The transaction is buffered by the receiver (FPGA 103B in the example shown) by using buffer 212B. The receiving side (FPGA 103B in the example shown) is programmed with a fixed delay value provided by delay circuit 236, which corresponds to the maximum delay of the transport. The receiving side (FPGA 103B in the example shown) compares the count value of its internal counter (counter 218B in the example shown) to the transaction header count (provided by buffer 212B in the example shown) plus the programmed delay. On the clock cycle when the two values compare (equal each other), the transaction is initiated on the receiver side (FPGA 103B in the example shown).

In exemplary embodiments, the transport bandwidth is selected such that the latency of any transaction can be bounded to a level that meets the maximum latency specification or requirement between the two adapter circuits (e.g., adapter circuits 209A, 209C). This maximum latency is system defined. A typical value, however, might be 50 cycles of the clock signal of the adapter interface. The transport bandwidth should also support the overhead of the packet transfer format. The exact bandwidth overhead specification or requirement may be determined from the type of user event being transferred, as persons of ordinary skill in the art understand.

A user event, for example, a packet, may be transferred in a variety of ways. For example, a protocol that provides a convenient interface mechanism, such as Avalon ST (well known to persons of ordinary skill in the art), may be used for packet transfer. The Avalon ST interface protocol is used as an example method for defining a packet level interface. Other streaming interfaces, such as AXI-4 Streaming, may be used, as persons of ordinary skill in the art understand.

An Avalon ST protocol as used for packet transfer includes several signals. Avalon ST interfaces use a number of signals, each of which has a defined set of properties, such as type, width, direction, etc. The Avalon ST interface signals include ready, valid, data, channel, and error signals. In addition, an Avalon ST interface may include signals for packet transfer, including startofpacket, endofpacket, and empty. Each of the Avalon ST has a prescribed direction, sink-to-source or source-to-sink. The Avalon ST interface and the above signals are well known to persons of ordinary skill in the art.

FIG. 4 shows the signaling scheme according to an exemplary embodiment that uses the Avalon ST protocol. Using Avalon ST terminology, the interface in FIG. 4 is denoted as a sink, and includes signals ready, valid, data, endofpacket, and startofpacket. The ready signal, one bit wide in the example shown, indicates that the interface is ready to accept data. The one-bit wide valid signal indicates that the data are valid. The data signal indicates the data to be transferred, and may be generally n bits wide, where n indicates an arbitrary width. The endofpacket signal, one bit wide, is a single beat pulse that marks the end of a packet. The one-bit wide startofpacket is a single beat pulse that marks the start of a packet.

The interface adapter captures the counter value when the packet transfer starts, buffers the packet, inserts the counter time stamp value (for example at the start of the packet) and transfers it on to the transport mechanism (for example, a Serial Lite SERDES). The receiving adapter buffers the packet, extracts the counter value and delays the packet until the local counter plus the programmed delay are equal. The receiving adapter transmits the received packet such that the start of packet occurs on the exact clock defined by the local counter plus the programmed delay. This delay is longer than the transport delay.

A simple FIFO interface may be constructed from a packet interface by removing the channel (if used), endofpacket, and startofpacket signals. Without these signals, each clock cycle in which data are transferred is considered to transfer a complete packet. The interface adapter adds the startofpacket and endofpacket signals for each data value transferred. The interface adapter then transfers the packet in the manner described above. FIG. 5 illustrates the protocol signaling scheme for a FIFO interface according to an exemplary embodiment.

A memory mapped interface may be constructed from a set of streaming packet interfaces. Construction of those packet interfaces, using the methods described above, provides one for one correspondence in behavior. The interface adapter breaks the memory mapped transaction down into a set of unidirectional packet transfers. These transfers meet the definition and specification provided above. Note that, generally speaking, memory mapped transactions may use adapters and transport in both directions between FPGAs (e.g., FPGAs 103A-B in FIG. 1) or among a general number of FPGAs.

In exemplary embodiments, the packet interface has a way to share transport mechanism with multiple packet types. As one example, one way to implement this feature is to use the "channel" interface signal on the Avalon ST interface. FIG. 6 shows the protocol signaling scheme according to an exemplary embodiment that uses the channel interface signal. Another exemplary technique is to embed the packet type into the packet header. An example of this technique may be implemented using AXI as the memory mapped protocol. The transaction is mapped onto five unidirectional packet types: write address, read address, write data, read data, write response. Each of these packet types is given a unique channel ID to allow the interface adapter to reconstruct what function each packet performs.

Exemplary embodiments provide the ability to handle a variety of events, such as user events. In some embodiments, an event may be a simple data value change. The transmitting or sending adapter has a set of signals as input. When the value presented by those signals changes, a data value change has occurred. A data value change may be encoded as a FIFO event by creating a one clock wide ready signal when a data value change is detected. The data transferred constitute the new data value. The event of a data value change can be detected with a circuit that delays the data value one clock cycle and performs an exclusive-OR (XOR) operation on the delayed value and the non-delayed value. The receiving adapter has a data output interface that is updated with the new data value.

The interfaces in exemplary embodiments may also support interrupts. In general, interrupts may be either edge sensitive or level sensitive. A level sensitive interrupt is, for example, a signal that is true when an interrupt is requested and false when an interrupt is not requested. This type of signal may be represented by a data value change as discussed above. An edge sensitive interrupt may be treated as a pulse of a sufficiently large width, such that it is detected by the receiver. A pulse may be encoded as a single signal data value change with the receiving interface producing a pulse transitions of the data value, as desired.

If the transport mechanism is fully synchronous across both FPGAs and has a known latency, then the logic to maintain latency correspondence may be removed. Alternatively the circuitry may be left, and disabled to reduce transport latency. As yet another alternative, the circuitry may be left and enabled with the latency overhead accepted.

In some embodiments, exact one to one latency correspondence is not specified or desired. That is, latency timing of the two separate FPGAs does not have to match exactly the behavior of the combined device. This relaxation allows for removal of the logic circuitry used to maintain latency correspondence.

Systems according to some embodiments are designed to be latency variation tolerant on their major interfaces (e.g., the interface between two FPGAs). If it is known that a system can tolerate latency variation on the interface coupled to the interface adapter, it is possible to remove the clock, initialization, counter and delay circuits that are used to force the transaction to occur on a known clock cycle, independent of transport. Doing so may provide another advantage other than reducing circuit complexity and cost. Specifically, when the single structured ASIC is constructed, the latency through the interface adapters will be lower than if latency correspondence is maintained. Alternatively, in some embodiments, the circuitry may be left or included, but disabled to reduce transport latency, power dissipation, or both. As another alternative, in some exemplary embodiments, the circuitry may be left or included and enabled with the latency overhead accepted.

Given two FPGAs (e.g., FPGAs 103A-103B in FIG. 1 or FIG. 2) that utilize interface adapters such as those described in this disclosure, a technique may be used to automatically couple them into a single netlist that represents the netlist of the final composed or configured structured ASIC (e.g., Hardcopy or Silicon pro device). A CAD tool may be used to generate the netlist for the structured ASIC (e.g., structured ASIC 203 in FIG. 2). In some embodiments, the netlist of the two separate devices may be represented at the register transfer level (RTL) or a lower level translation compiled for a specific device. If used, the lower level translation should maintain the signal boundaries between the user event and the interface adapter.

The interface adapter circuitry or intellectual property (IP) should be marked such that a tool may identify it as an interface adapter. In some embodiments, one may add a unique pragma to the RTL with a defined keyword pair or token (e.g., transport_interface_adapter=1). Furthermore, the associated interface adapter on the other FPGA(s) should be marked in a way that allows a tool to identify the associated adapters. In some embodiments, one may use the same numeric value in the above pragma for associated adapters.

Figure 7:
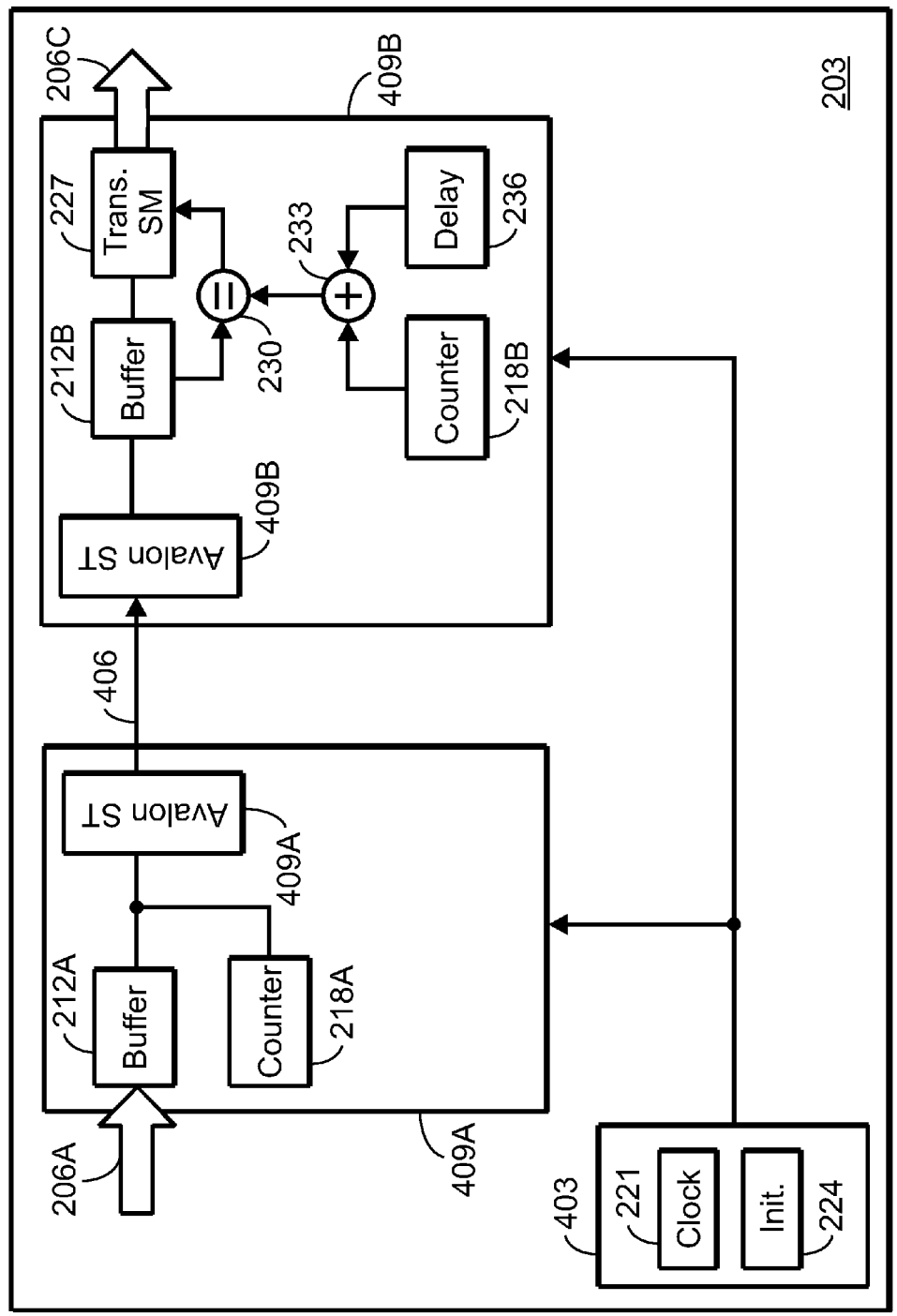
FIG. 7 illustrates a block diagram of a structured ASIC according to an exemplary embodiment.

FIG. 7 shows the block diagram of a resulting structured ASIC 203 according to an exemplary embodiment. To generate the netlist for the structured ASIC, the CAD tool finds the interface adapters in the FPGA netlists, traverses the interconnect from the interface adapter to the I/O pin(s) used to communicate via the adapter, and removes logic circuitry (and/or other circuitry) between the interface adapter and the I/O pin(s). An internal interface adapter (i.e., an adapter ultimately used internally to the structured ASIC) is inserted in place of the removed FPGA circuitry. Thus, interface adapter 209A replaces circuitry removed from FPGA 103A, whereas interface adapter 209B replaces circuitry removed from FPGA 103B.

Internal interface adapter circuits 409A-409B cooperate to provide a desired interface, such as a simple streaming interface circuit in some embodiments (for example, an Avalon Streaming interface), in place of the FPGA to FPGA transport. The CAD tool couples interface adapter circuit 409A to interface adapter circuit 409B at the streaming interface via link 406. Clock circuit 221 and initialization circuit 224, which may be combined into one block or circuit 403, replace clock circuits 221A-221B and initialization circuits 224A-224B (see FIG. 3). Clock circuit 221 and initialization circuit 224 provide common clock and initialization signals to interface adapter circuits 409A-409B.

Note that the circuit arrangement shown in FIG. 7 provides the functionality associated with user events 206A, 206C in FIG. 3, i.e., events that entail communication from FPGA 103A to FPGA 103B. As persons of ordinary skill in the art understand, however, interface adapter circuits 409A-409B and associated circuitry may be used to provide the functionality associated with user events 206B, 206D in FIG. 3. Alternatively, interface adapter circuits in addition to interface adapter circuits 409A-409B may be added to provide the functionality associated with user events 206A-206D in FIG. 3. Furthermore, structured ASIC 203 in FIG. 7 may include the circuitry (e.g., logic circuitry, interconnect circuitry, etc., as shown for example in FIG. 2) associated with implementing the user's design. As persons of ordinary skill in the art understand, such circuitry may be included in structured ASIC 203 in exemplary embodiments so as to provide one to one functionality or behavior between FPGAs 103A-103B, such as depicted in FIGS. 1 and 3 (or generally a plurality of FPGAs), and structured ASIC 203.

Figure 8:
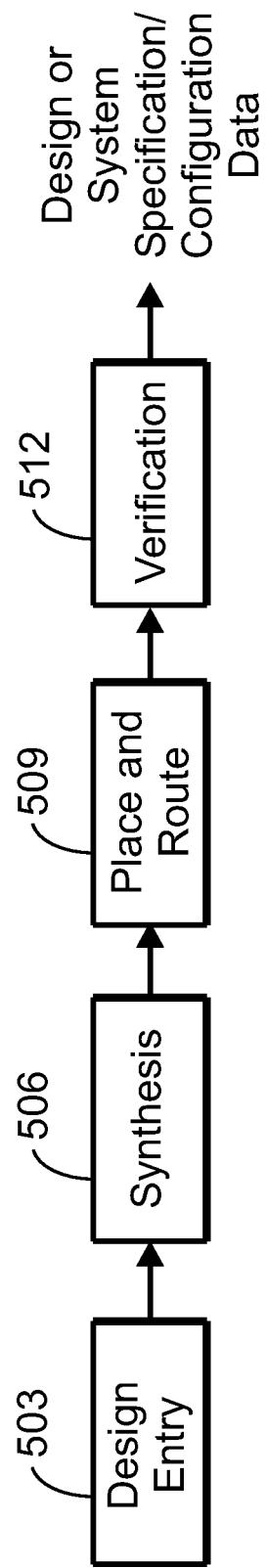
FIG. 8 shows a computer aided design (CAD) flow for configuring or composing structured ASICs according to an exemplary embodiment.

As described, a CAD flow or software may be used to generate the specifications, such as a netlist, for structured ASIC 203. The CAD flow may also be used to implement the user's design in two or more FPGAs (e.g., FPGAs 103A-103B in FIGS. 1, 3). FIG. 8 illustrates a CAD flow according to an exemplary embodiment. The CAD flow includes design-entry module 503, synthesis module 506, place-and-route module 509, and verification module 512.

Design-entry module 503 allows the editing of various design description files using graphical or textual descriptions of a circuit or its behavior, such as schematics, hardware description languages (HDL), RTL, or waveforms, as desired. The user may generate the design files by using design-entry module 503 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired. Design-entry module may generate the specifications for structured ASIC 203, using the specifications, such as netlist, of the FPGAs.

Synthesis module 506 accepts the output of design-entry module 503. Based on the user-provided design, synthesis module 506 generates appropriate logic circuitry that realizes the user-provided design. One or more FPGAs (not shown explicitly), such as FPGA 103 in FIG. 2, implement the synthesized overall design or system. Synthesis module 506 may also generate any glue logic that allows integration and proper operation and interfacing of various modules in the user's designs. For example, synthesis module 506 provides appropriate hardware so that an output of one block properly interfaces with an input of another block.

Synthesis module 506 may provide appropriate hardware so as to meet the specifications of each of the modules in the overall design or system. Furthermore, synthesis module 506 may include algorithms and routines for optimizing the synthesized design. Through optimization, synthesis module 506 seeks to more efficiently use the resources of the FPGAs that implement the overall design or system. Synthesis module 506 may also provide the appropriate circuitry for structured ASIC 203. Synthesis module 506 provides its output to place-and-route module 509. Following synthesis, one may include a technology mapping module (not shown in FIG. 7).

Place-and-route module 509 uses the designer's specifications, for example, timing specifications to perform optimal logic mapping and placement. The logic mapping and placement determine the use of logic resources within the FPGAs. By using particular resources, such as programmable logic 106 and/or programmable interconnects within the FPGA(s) for certain parts of the design, place-and-route module 509 helps optimize the performance of the overall design or system. By the proper use of FPGA resources, place-and-route module 509 helps to meet the critical timing paths of the overall design or system. Place-and-route module 509 may also optimize the critical timing paths to help provide timing closure faster. As a result, the overall design or system can achieve faster performance (i.e., operate at a higher clock rate or have higher throughput).

Verification module 512 performs simulation and verification of the design. The simulation and verification seek in part to verify that the design complies with the user's prescribed specifications. The simulation and verification also aim at detecting and correcting any design problems before prototyping the design. Thus, verification module 512 helps the user to reduce the overall cost and time-to-market of the overall design or system. Verification module 512 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and the like. Note that one may perform other or additional verification techniques as desired. Furthermore, verification of the design may also be performed at other phases in the flow, as appropriate, and as desired.

Figure 9:
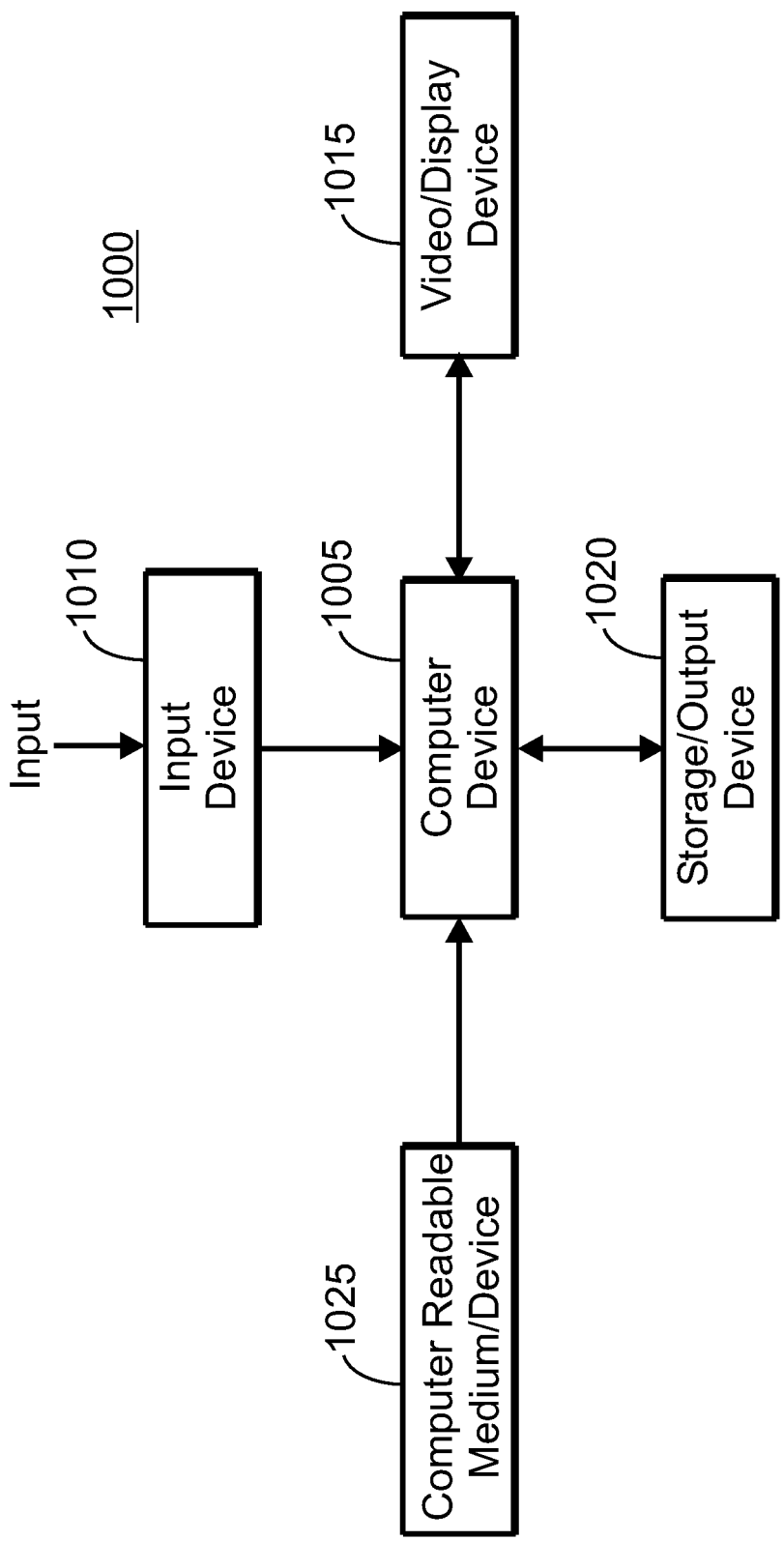
FIG. 9 illustrates a block diagram of an exemplary system for information processing according to the disclosed concepts.

According to one aspect of the disclosed concepts, one may perform, run, or execute the disclosed algorithms, methods, flows, or software, such as the CAD flow described above, on computer systems, devices, processors, controllers, etc. FIG. 9 shows a block diagram of an exemplary system 1000 for processing information according an exemplary embodiment. System 1000 includes a computer device 1005, an input device 1010, a video/display device 1015, and a storage/output device 1020, although one may include more than one of each of those devices, as desired.

Computer device 1005 couples to input device 1010, video/display device 1015, and storage/output device 1020. System 1000 may include more than one computer device 1005, for example, a set of associated computer devices or systems, as desired.

Typically, system 1000 operates in association with input from a user. The user input typically causes system 1000 to perform information-processing tasks, such as the disclosed information-processing tasks, including CAD flow or software, etc. System 1000 in part uses computer device 1005 to perform those tasks. Computer device 1005 includes information-processing circuitry, such as a central-processing unit (CPU), controller, microcontroller, etc., although one may use more than one such device or information-processing circuitry, as persons skilled in the art would understand.

Input device 1010 receives input from the user and makes that input available to computer device 1005 for processing. The user input may include data, instructions, or both, as desired. Input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to computer device 1005. Similarly, the user operates the pointing device to provide cursor position or control information to computer device 1005.

Video/display device 1015 displays visual images to the user. Video/display device 1015 may include graphics circuitry, such as graphics processors, as desired. The visual images may include information about the operation of computer device 1005, such as graphs, pictures, images, and text. Video/display device 1015 may include a computer monitor or display, a projection device, and the like, as persons of ordinary skill in the art would understand. If system 1000 uses a touch-sensitive display, the display may also operate to provide user input to computer device 1005.

Storage/output device 1020 allows computer device 1005 to store information for additional processing or later retrieval (e.g., softcopy), to present information in various forms (e.g., hardcopy), or both. As an example, storage/output device 1020 may include a magnetic, optical, semiconductor, or magneto-optical drive capable of storing information on a desired medium and in a desired format. As another example, storage/output device 1020 may constitute a printer, plotter, or other output device to generate printed or plotted expressions of the information from computer device 1005.

Computer-readable medium 1025 interrelates structurally and functionally to computer device 1005. Computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by computer-readable medium 1025, the functional descriptive material imparts functionality. The functional descriptive material interrelates to computer-readable medium 1025.

Information structures within the functional descriptive material define structural and functional interrelations between the information structures and computer-readable medium 1025 and/or other aspects of system 1000. These interrelations permit the realization of the information structures' functionality.

Moreover, within such functional descriptive material, computer programs define structural and functional interrelations between the computer programs and computer-readable medium 1025 and other aspects of system 1000. These interrelations permit the realization of the computer programs' functionality. Thus, in a general sense, computer-readable medium 1025 includes information, such as instructions, that when executed by computer device 1005, cause computer device 1005 (system 1000, generally) to provide the functionality prescribed by a computer program, software, method, algorithm, etc., as included (partially or entirely) in computer-readable medium 1025.

By way of illustration, computer device 1005 reads, accesses, or copies functional descriptive material into a computer memory (not shown explicitly in the figure) of computer device 1005. Computer device 1005 performs operations in response to the material present in the computer memory. Computer device 1005 may perform the operations of processing a computer application that causes computer device 1005 to perform additional operations. Accordingly, the functional descriptive material exhibits a functional interrelation with the way computer device 1005 executes processes and performs operations.

Furthermore, computer-readable medium 1025 constitutes an apparatus from which computer device 1005 may access computer information, programs, code, and/or applications. Computer device 1005 may process the information, programs, code, and/or applications that cause computer device 1005 to perform additional or desired tasks or operations.

Note that one may implement computer-readable medium 1025 in a variety of ways, as persons of ordinary skill in the art would understand. For example, memory within computer device 1005 may constitute a computer-readable medium 1025, as desired.

Alternatively, computer-readable medium 1025 may include a set of associated, interrelated, coupled (e.g., through conductors, fibers, etc.), or networked computer-readable media, for example, when computer device 1005 receives the functional descriptive material from a network of computer devices or information-processing systems. Note that computer device 1005 may receive the functional descriptive material from computer-readable medium 1025, the network, or both, as desired.

The disclosure provided above refers to various exemplary embodiments that use illustrative or exemplary interfaces, buses, protocols, technology, circuitry, or the like, such as Hard Copy, Silicon Pro, Avalon ST, or Serial Lite. One may, however, in other embodiments according to the disclosed concepts use a variety of interfaces, buses, protocols, technology, circuitry, etc., as desired, by making appropriate modifications (for example, rather than FPGAs, one may use programmable logic devices (PLDs), complex PLDs (CPLDs), etc.). Those modifications fall within the knowledge and level of skill of persons of ordinary skill in the art who have the benefit of the description of the disclosed concepts.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus for implementing an electronic design, comprising:
   a structured application specific integrated circuit (ASIC), comprising:
      first circuitry adapted to implement functionality of a first field programmable gate array (FPGA) that implements a first part of the electronic design; and
      second circuitry adapted to implement functionality of a second FPGA that implements a second part of the electronic design.

2. The apparatus according to claim 1 wherein a first and second user events in the first and second FPGAs, respectively, are mapped to corresponding user events in the structured ASIC.

3. The apparatus according to claim 1, wherein the first circuitry is coupled to the second circuitry via an interface circuit adapted to operate according to an interface protocol.

4. The apparatus according to claim 3, wherein the first circuitry comprises a first interface adapter coupled to the transport circuit, and wherein the second circuitry comprises a second interface adapter coupled to the transport circuit.

5. The apparatus according to claim 3, the interface protocol comprises a streaming protocol.

6. The apparatus according to claim 5, wherein the protocol comprises an Avalon ST protocol.

7. The apparatus according to claim 3, wherein the interface protocol comprises a first in, first out (FIFO) protocol.

8. The apparatus according to claim 3, wherein the interface protocol comprises a memory mapped protocol.

9. The apparatus according to claim 3, wherein the interface circuitry comprises circuitry for serial transport of data.

10. The apparatus according to claim 3, wherein the interface circuit is adapted to time stamp responses to transactions.

11. The apparatus according to claim 3, wherein the interface circuit is adapted to use a fixed latency transport.

12. The apparatus according to claim 3, wherein the interface circuit is adapted to use a variable latency transport.

13. An apparatus, comprising a single structured application specific integrated circuit (ASIC), comprising circuitry composed from a plurality of field programmable gate arrays (FPGAs), wherein the circuitry is adapted to provide one to one behavior between the structured ASIC and the plurality of FPGAs.

14. The apparatus according to claim 13, wherein the structured ASIC is adapted to use an interface protocol.

15. The apparatus according to claim 14, wherein the interface protocol includes ready, valid, and data signals.

16. The apparatus according to claim 14, wherein the interface protocol is transport independent.

17. The apparatus according to claim 14, wherein the interface protocol uses a transport circuit having a transport bandwidth.

18. The apparatus according to claim 17, wherein the transport bandwidth is selected such that a latency of a transaction can be bounded to a level that meets a specified latency between two adapter circuits in the structured ASIC.

19. A method, comprising:
   adapting first circuitry in a structured application specific integrated circuit (ASIC) to implement a functionality of at least a part of circuitry in a first field programmable gate array (FPGA);
   adapting second circuitry in the structured ASIC to implement a functionality of at least a part of circuitry in a second FPGA; and
   coupling first and second circuitry via a transport mechanism.

20. The method according to claim 19, wherein the first and second circuitry are adapted to provide one to one functionality between the first and second FPGAs and the structured ASIC.

21. The method according to claim 19, wherein the circuitry in the first FPGA comprises a first interface circuit coupled to receive a first event.

22. The method according to claim 21, wherein the circuitry in the second FPGA comprises a second interface circuit coupled to the first interface circuit in the first FPGA via a link, wherein the second interface circuit is adapted to provide a second event.

23. The method according to claim 19, wherein adapting the first circuitry and the second circuitry in the structured ASIC to implement the functionalities of at least a part of first and second circuitry in the first and second FPGAs, respectively, comprises using a computer aided design (CAD) flow.

* * * * *